United States Patent
Lin et al.

(10) Patent No.: US 6,451,654 B1
(45) Date of Patent: Sep. 17, 2002

(54) PROCESS FOR FABRICATING SELF-ALIGNED SPLIT GATE FLASH MEMORY

(75) Inventors: Chi-Hui Lin, Taipei; Chung-Lin Huang, Taichung; Yung-Meng Huang, Taipei, all of (TW)

(73) Assignee: Nanya Technology Corporation (TW)

( * ) Notice: Subject to any disclaimer, the term of this patent is extended or adjusted under 35 U.S.C. 154(b) by 0 days.

(21) Appl. No.: 10/029,429

(22) Filed: Dec. 18, 2001

(51) Int. Cl.$^7$ ............................................. H01L 21/8247
(52) U.S. Cl. ........................ 438/266; 438/296; 438/435
(58) Field of Search ................................. 438/259, 266, 438/267, 296, 435, 589, 593, 594

(56) References Cited

U.S. PATENT DOCUMENTS

| | | | | |
|---|---|---|---|---|
| 6,140,182 A | * | 10/2000 | Chen | 438/296 |
| 6,159,801 A | * | 12/2000 | Hsieh et al. | 438/267 |
| 6,309,928 B1 | * | 10/2001 | Sung et al. | 438/267 |
| 6,358,769 B1 | * | 3/2002 | Lin et al. | 438/435 |

FOREIGN PATENT DOCUMENTS

JP          11-103033    *    4/1999

* cited by examiner

Primary Examiner—Chandra Chaudhari
(74) Attorney, Agent, or Firm—Ladas & Parry

(57) ABSTRACT

The present invention provides a process for fabricating a self-aligned split gate flash memory. First, a patterned gate oxide layer, a first patterned polysilicon layer, and a first patterned mask layer are successively formed on a semiconductor substrate, and a first insulating spacer is formed on their sidewalls. Then, shallow trench isolation (STI) is formed in the substrate using the first patterned mask layer and the first insulating spacer as a mask. Then, the first patterned mask layer and a part of the first insulating spacer are removed to expose the first patterned polysilicon layer. A floating gate region is defined on the first patterned polysilicon layer, and the surface of the first polysilicon layer in the floating gate region is selectively oxidized to form polysilicon oxide layer. Then, the polysilicon oxide layer is used as a mask to remove the underlying first polysilicon layer in a self-aligned manner to form a floating gate. Finally, an intergate insulating layer and a second patterned polysilicon layer as a control gate are succesively formed on the polysilicon oxide layer. The present invention forms a floating gate in a self-aligned manner, which can decreases critical dimension. When an oxidation process is conducted to form the above polysilicon oxide layer, the nitride liner layer and the insulating spacer formed in the trench protect the sides of floating gate from oxygen invasion. This prevents the line width of floating gate from size reduction. Current leakage is also be avoided.

20 Claims, 11 Drawing Sheets

PROCESS FOR FABRICATING SELF-ALIGNED SPLIT GATE FLASH MEMORY

BACKGROUND OF THE INVENTION

1. Field of the Invention

The present invention relates to a process for fabricating a self-aligned split gate flash memory, and more particularly to a process for fabricating a self-aligned split gate flash memory, involving formation of a nitride liner layer and an insulating spacer in the trench to avoid current leakage and form a sharper polysilicon tip.

2. Description of the Prior Art

Flash memory is a type of erasable programmable read-only memory (EPROM), which in turn is a type of non-volatile memory. In general, flash memory includes two gates. One of the gates, known as a floating gate, is used for charge storage. The second gate, known as a control gate, is used for controlling the input and output of data. The floating gate is located beneath the control gate, and is generally in a floating state because there is no connection with external circuits. The control gate is normally wired to the word line. One of the advantages of flash memory is its capacity for block-by-block memory erasure. Furthermore, the speed of memory erasure is fast, and normally takes just 1 to 2 seconds for the complete removal of a whole block of memory. Therefore, in recent years, flash memory has been widely utilized in electrical consumer products, such as digital cameras, digital video cameras, cellular phones, laptop computers, mobile cassette players, and personal digital assistants (PDA).

The conventional process for fabricating flash memory usually uses photomasks to define the devices. Since the precision of the photomasks is limited, misalignment usually occurs for devices with a smaller line width. This causes open circuits or short circuits, and the electrical properties of the flash memory fail. Therefore, the device size of the conventional flash memory is limited by the design rule, so it is difficult to shrink the device size.

SUMMARY OF THE INVENTION

An object of the present invention is to solve the above-mentioned problems and provide a process for fabricating a split gate flash memory in a self-aligned manner, which decreases tolerance and shrinks the device size.

Another object of the present invention is to provide a process for fabricating a split gate flash memory to avoid current leakage.

A further object of the present invention is to provide a process for fabricating a split gate flash memory to form a sharper polysilicon tip, which is helpful in erase operations.

To achieve the above objects, according to a first aspect of the present invention, the process for fabricating a self-aligned split gate flash memory includes successively forming a gate oxide layer, a first polysilicon layer, and a first mask layer on a semiconductor substrate; patterning the gate oxide layer, first polysilicon layer, and first mask layer; forming a first insulating spacer on the sidewalls of the patterned gate oxide layer, the first patterned polysilicon layer, and the first patterned mask layer; forming a trench in the substrate using the first patterned mask layer and the first insulating spacer as a mask; filling an insulator into the trench; removing the first patterned mask layer and a part of the first insulating spacer to expose the first patterned polysilicon layer; forming a second patterned mask layer on the first patterned polysilicon layer while exposing a part of the first polysilicon layer to define a floating gate region; selectively oxidizing the exposed surface of the first polysilicon layer using the second patterned mask layer as a mask to form a polysilicon oxide layer; removing the second patterned mask layer; using the polysilicon oxide layer as a mask to remove the underlying first polysilicon layer in a self-aligned manner to form a floating gate; and successively forming an intergate insulating layer and a second patterned polysilicon layer as a control gate on the polysilicon oxide layer.

According to a second aspect of the present invention, the process for fabricating a self-aligned split gate flash memory includes successively forming a gate oxide layer, a first polysilicon layer, and a first mask layer on a semiconductor substrate; patterning the gate oxide layer, first polysilicon layer, and first mask layer; forming a trench in the substrate using the first patterned mask layer as a mask; filling an insulator into the trench such that the height of the insulator is lower than the height of the first patterned mask layer to form a recess in the trench; removing the first patterned mask layer to expose the first patterned polysilicon layer; forming a second patterned mask layer on the first patterned polysilicon layer while exposing a part of the first polysilicon layer to define a floating gate region, such that a part of the second mask layer remains on the sidewall of the first polysilicon layer in the recess to form a first insulating spacer; selectively oxidizing the exposed surface of the first polysilicon layer using the second patterned mask layer as a mask to form a polysilicon oxide layer; removing the second patterned mask layer; using the polysilicon oxide layer as a mask to remove the underlying first polysilicon layer in a self-aligned manner to form a floating gate; and successively forming an intergate insulating layer and a second patterned polysilicon layer as a control gate on the polysilicon oxide layer.

According to a third aspect of the present invention, the process for fabricating a self-aligned split gate flash memory includes successively forming a gate oxide layer, a first polysilicon layer, and a first mask layer on a semiconductor substrate; patterning the gate oxide layer, first polysilicon layer, and first mask layer; forming a first insulating spacer on the sidewalls of the patterned gate oxide layer, the first patterned polysilicon layer, and the first patterned mask layer; forming a trench in the substrate using the first patterned mask layer and the first insulating spacer as a mask; filling an insulator into the trench such that the height of the insulator is lower than the height of the first patterned mask layer to form a recess in the trench; removing the first patterned mask layer and a part of the first insulating spacer to expose the first patterned polysilicon layer; forming a second patterned mask layer on the first patterned polysilicon layer while exposing a part of the first polysilicon layer to define a floating gate region, such that a part of the second mask layer remains on the sidewall of the first polysilicon layer in the recess to form a second insulating spacer; selectively oxidizing the exposed surface of the first polysilicon layer using the second patterned mask layer as a mask to form a polysilicon oxide layer; removing the second patterned mask layer; using the polysilicon oxide layer as a mask to remove the underlying first polysilicon layer in a self-aligned manner to form a floating gate; and successively forming an intergate insulating layer and a second patterned polysilicon layer as a control gate on the polysilicon oxide layer.

By means of selectively oxidizing the surface of the first polysilicon layer to form a polysilicon oxide layer, the floating gate can be formed in a self-aligned manner. Thus, the device size can be shrunk.

During the oxidation process to form the above polysilicon oxide layer, the nitride liner layer and the insulating spacer formed in the trench and the insulating spacer formed in the recess above the trench insulator can prevent oxygen entering from the side. Thus, a sharper polysilicon tip can be formed, which is helpful in erasing operation. Also, this can prevent the line width of floating gate from size reduction and avoid current leakage.

BRIEF DESCRIPTION OF THE DRAWINGS

The present invention will become more fully understood from the detailed description given hereinbelow and the accompanying drawings, given by way of illustration only and thus not intended to be limitative of the present invention.

FIGS. 1 to 13 are cross-sections showing the process flow of fabricating the self-aligned split gate flash memory according to a preferred embodiment of the present invention, wherein FIGS. 1 to 8 are ones taken along line A–A' and FIGS. 9 to 13 are ones taken along line B–B'.

DETAILED DESCRIPTION OF THE PREFERRED EMBODIMENTS

Figure 1:
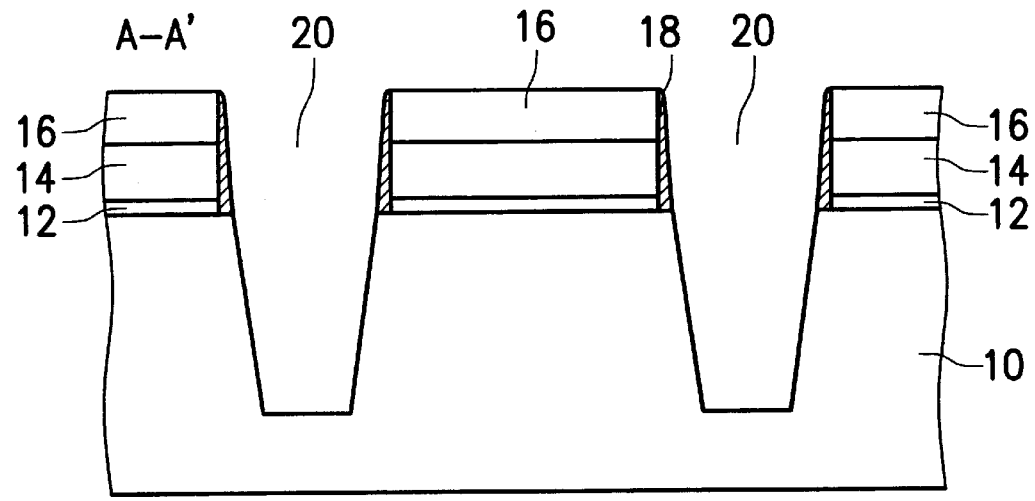
Figure 1A:
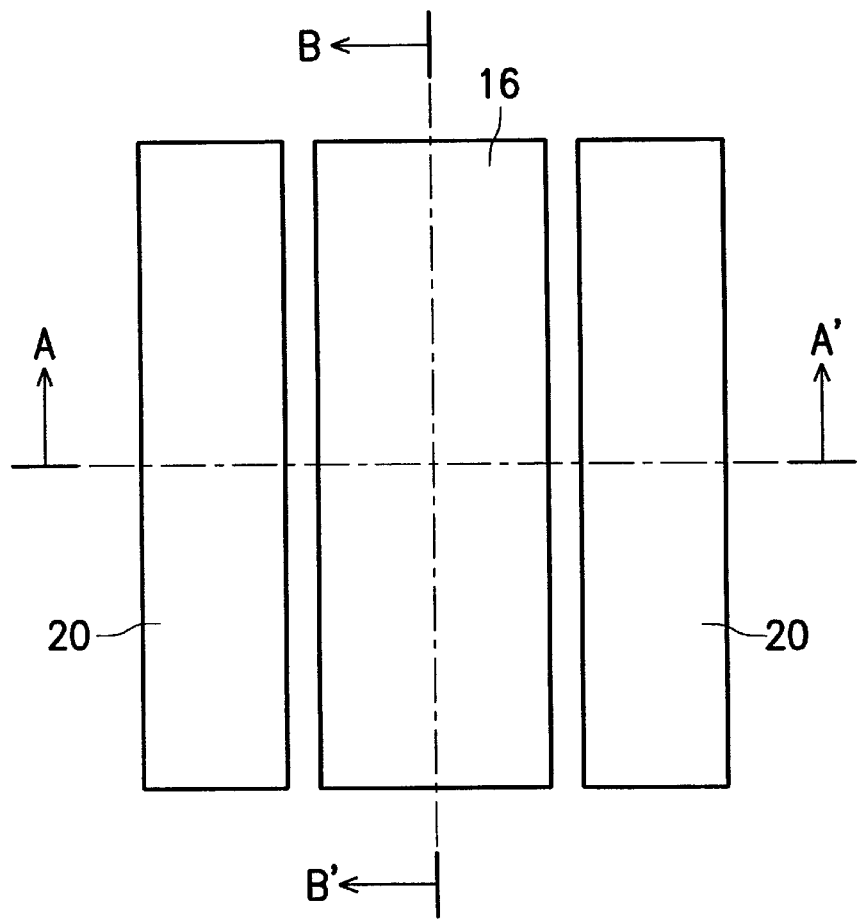
FIGS. 1A, 7A, 8A, 9A, and 13A are top views illustrating a portion of the steps for fabricating the self-aligned split gate flash memory according to a preferred embodiment of the present invention.

Referring to FIGS. 1 and 1A, a patterned gate oxide layer 12, a first patterned polysilicon layer 14, and a first patterned mask layer 16 are successively formed on a semiconductor substrate 10.

For example, first, a gate oxide layer, a first polysilicon layer, and a mask layer (all of these layers are not shown) are successively formed on a silicon substrate. The gate oxide layer can be formed by thermal oxidation at 750° C. to 950° C. to a thickness of 70 Å to 100 Å. Alternatively, the gate oxide layer can be formed by an atmospheric or low pressure chemical vapor deposition (LPCVD) process. The first polysilicon layer can be formed by a chemical vapor deposition process, for example, formed by a LPCVD process employing silane ($SiH_4$) as a silicon source material at a temperature range between 350° C. to 650° C. The polysilicon is preferably doped with phosphorus. For example, the polysilicon can be implanted with phosphorus at a dosage level between about $1\times10^{14}$ to $2\times10^{14}$ atoms/cm$^2$ at an energy level between about 20 to 30 keV. The first mask layer 16 can be a silicon nitride layer and can be formed by reacting dichlorosilane ($SiCl_2H_2$) with ammonia ($NH_3$) through a LPCVD process. Next, a photoresist layer is formed on the first mask layer to protect an active region which will be formed later. The oxide layer, the first polysilicon layer, and the first mask layer are anisotropically etched using the photoresist layer as a mask. The photoresist layer is then removed.

Subsequently, a first insulating spacer 18 is formed on the sidewalls of the patterned gate oxide layer 12, the first patterned polysilicon layer 14, and the first patterned mask layer 16. The first insulating spacer 18 can be silicon nitride. For example, a silicon nitride layer is formed by a CVD method on the entire surface of the semiconductor substrate, and then the silicon nitride layer is anisotropically etched to form the first insulating spacer 18. Next, a trench 20 is formed in the semiconductor substrate 10 using the first patterned mask layer 16 and the first insulating spacer 18 as masks. The trench 20 can be formed by dry etching to a thickness of 2500 Å to 6000 Å.

Figure 2:
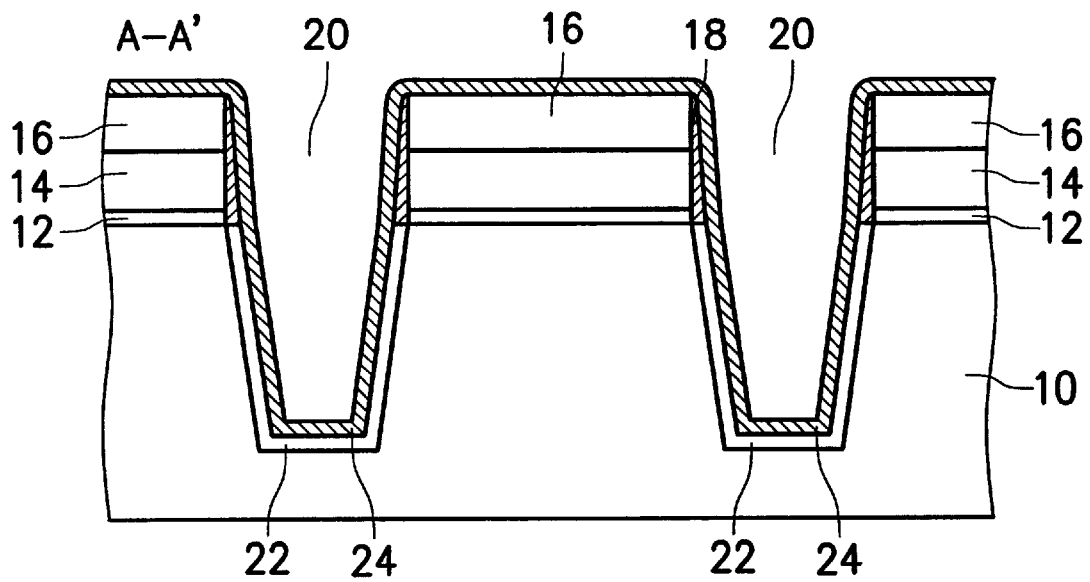

Subsequently, referring to FIG. 2, an oxide liner layer 22 and a nitride liner layer 24 are formed on the surface of the trench 20. The oxide liner layer can be silicon oxide formed by thermal oxidation at 900° C. to 1150° C. to a thickness 50 Å to 500 Å. The formation of the nitride liner layer 24 is described here. A silicon nitride layer having a thickness of 50 Å to 500 Å is conformally formed by CVD on the semiconductor substrate 10. Then, the silicon nitride layer 24 covering the mask layer 16 is removed by CMP, leaving the silicon nitride liner layer 24 on the surface of the trench 20. The silicon nitride liner layer 24 can extend to adjacent the first insulating spacer 18. The silicon nitride liner layer 24 may be partially or completely removed by CMP. Also, part of the underlying mask layer 16 may be simultaneously removed.

Figure 3:
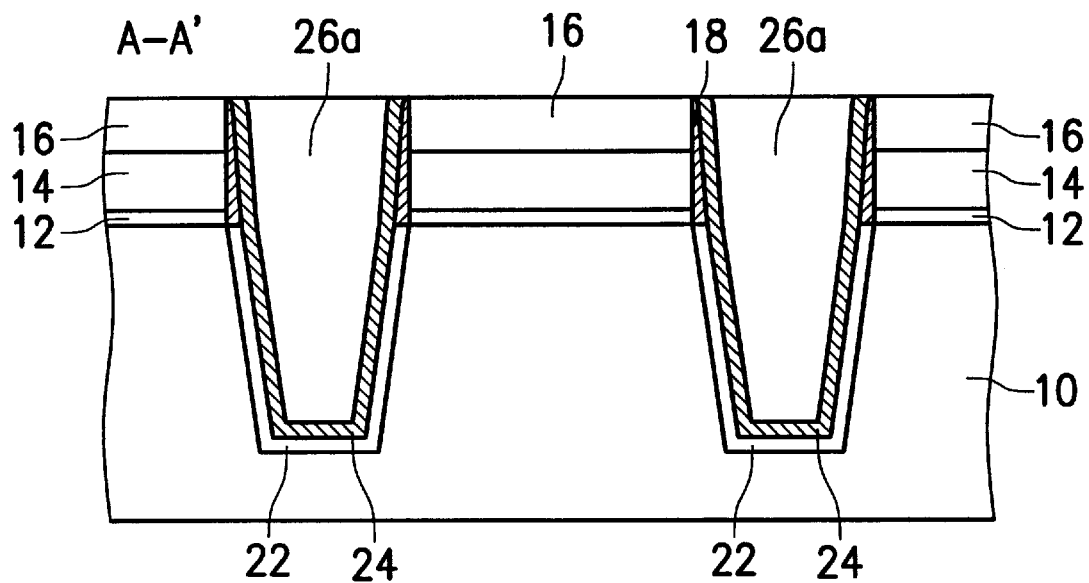

Subsequently, referring to FIG. 3, an insulating layer (not shown) is formed on the entire surface of the semiconductor substrate 10 to fill the insulator into the trench 20. For example, the insulating layer can be a silicon oxide layer formed using TEOS (tetraethosiloxane; $Si(OC_2H_5)_4$ as a gas source through a CVD method. Next, the insulating layer is planarized by a chemical mechanical polishing (CMP) method using the first patterned mask layer 16 as a polishing stop layer to form an insulator 26a.

Figure 4:
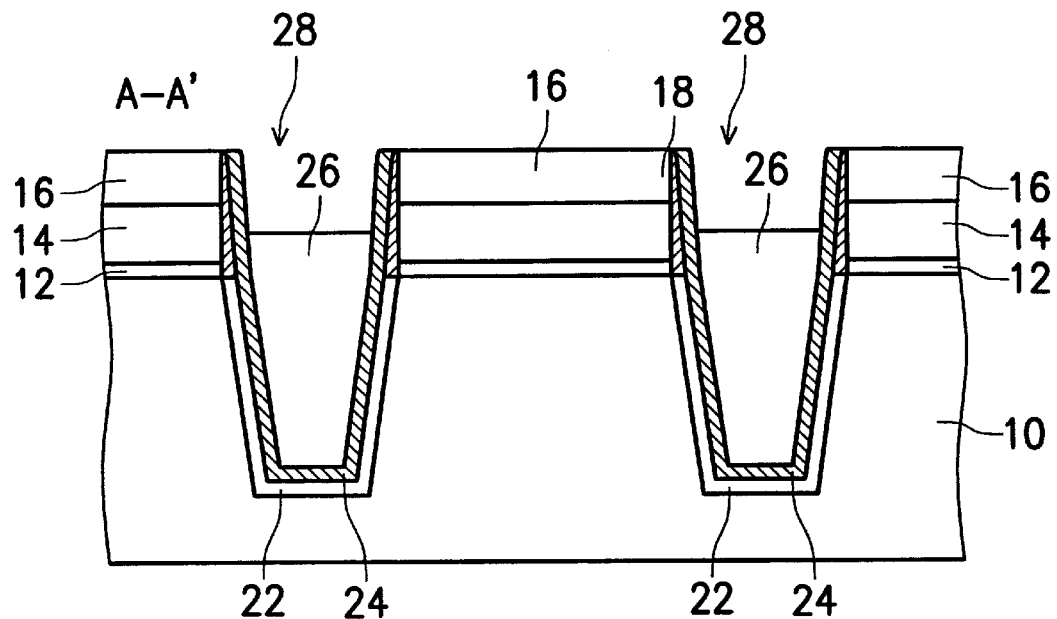

Subsequently, referring to FIG. 4, a predetermined height of the insulator 26a in the trench is removed to form an insulator 26, such that the height of the insulator 26 is lower than that of the first patterned mask layer 16. In this way, a recess 28 is formed in the trench 20. FIG. 4 shows that the height of the insulator 26 is lower than that of the first patterned polysilicon layer 14.

Figure 5:
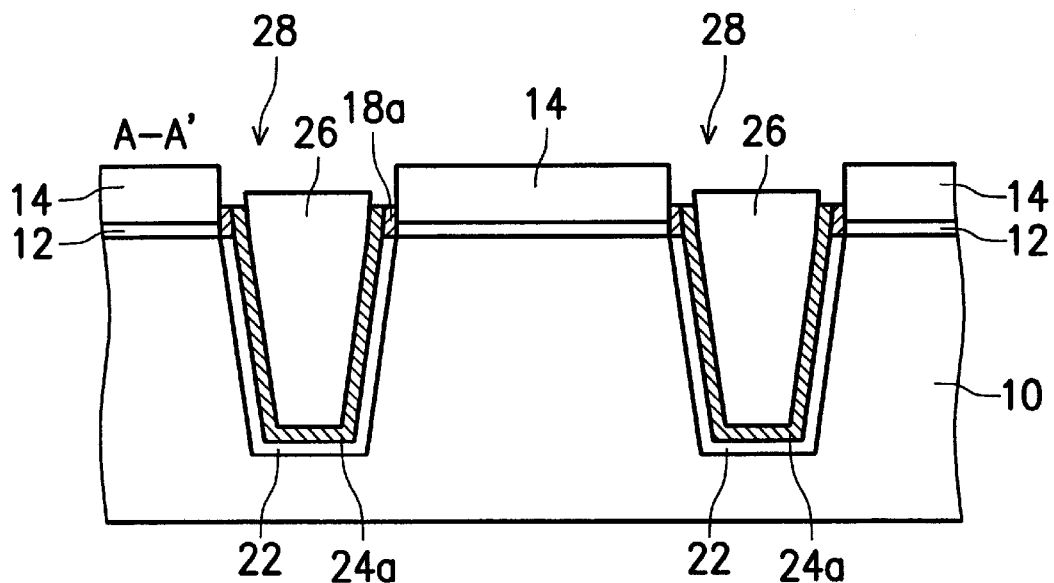

Subsequently, referring to FIG. 5, wet etching is conducted to remove the first patterned mask layer 16 to expose the first patterned polysilicon layer 14. When the first patterned mask layer 16, first insulating spacer 18, and nitride liner layer 24 are of the same material, for example, silicon nitride. When wet etching is conducted to remove the first patterned mask layer 16, a part of the first insulating spacer 18 may be removed simultaneously to form a spacer labeled with 18a. Also, a part of the nitride liner layer 24 may be removed to form a liner layer labeled with 24a.

Figure 6:
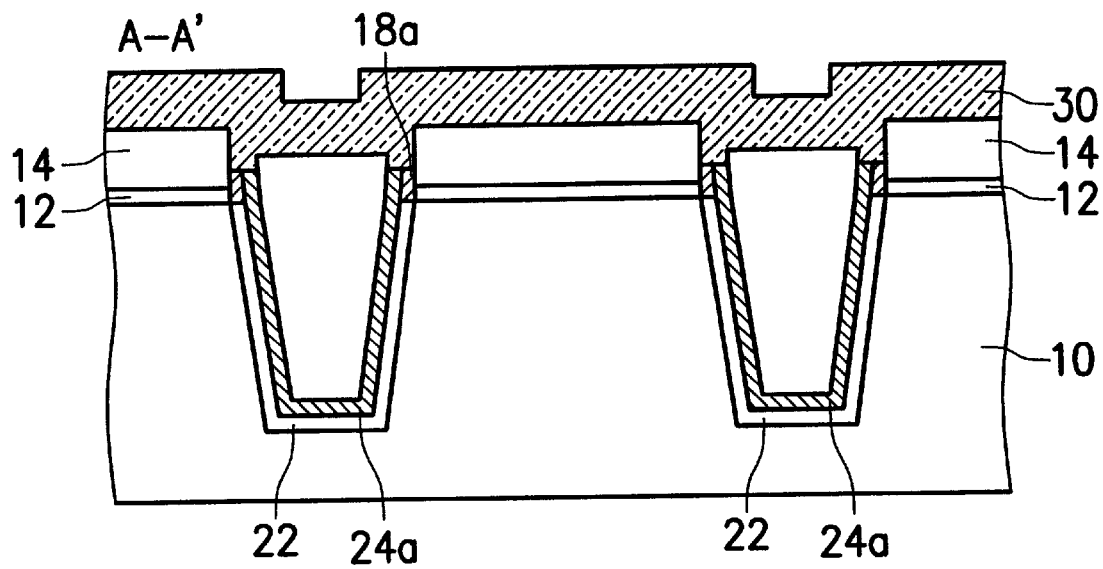

Subsequently, referring to FIG. 6, a second mask layer 30 is formed over the entire surface of the semiconductor substrate 10, such that the second mask layer 30 is filled into the recess 28. The second mask layer 30 can be a silicon nitride layer formed by LPCVD using dichlorosilane ($SiCl_2H_2$) and ammonia ($NH_3$) as reacting gases.

Figure 7:
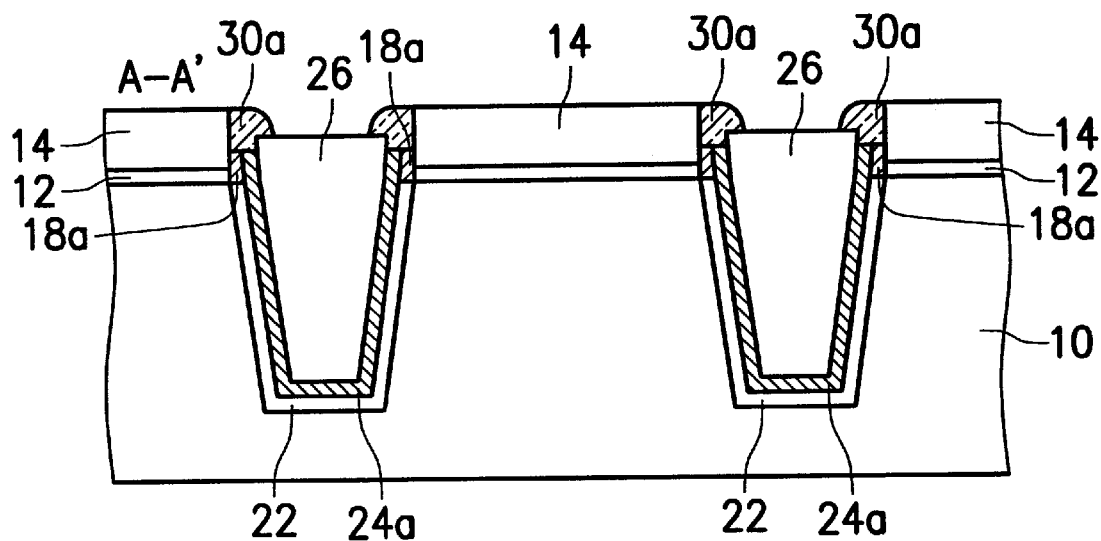
Figure 7A:
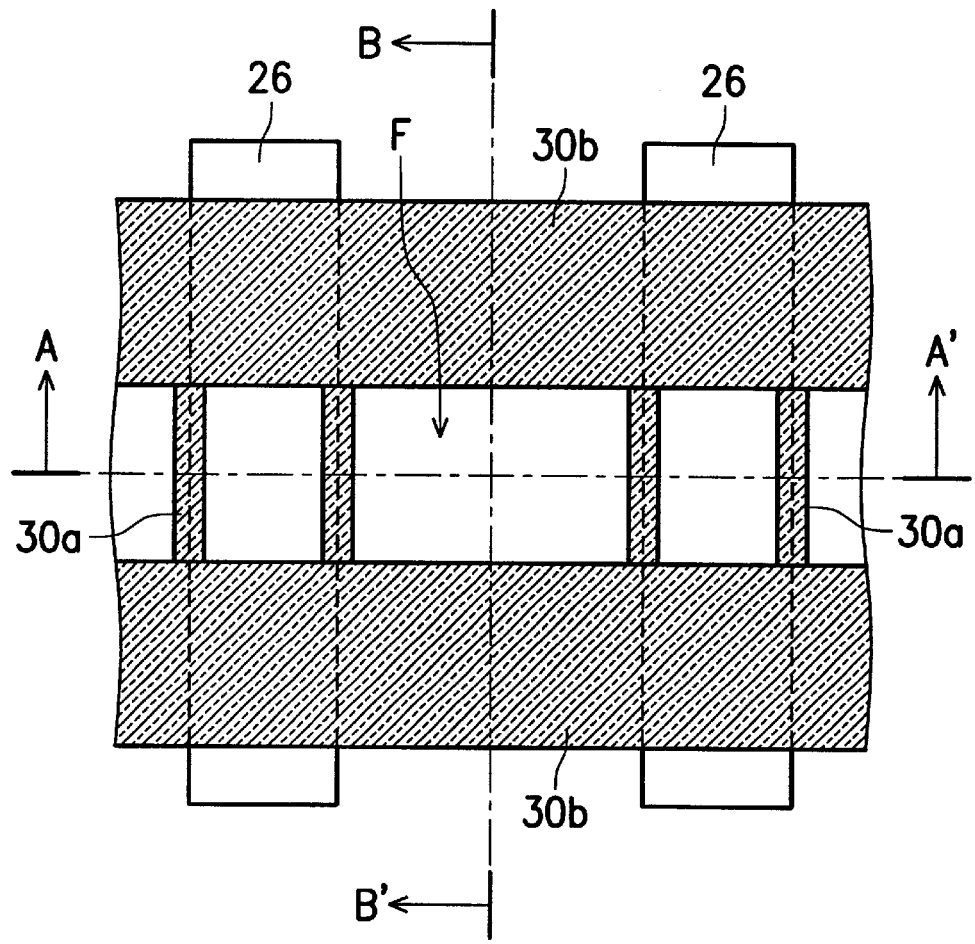
Figure 7B:
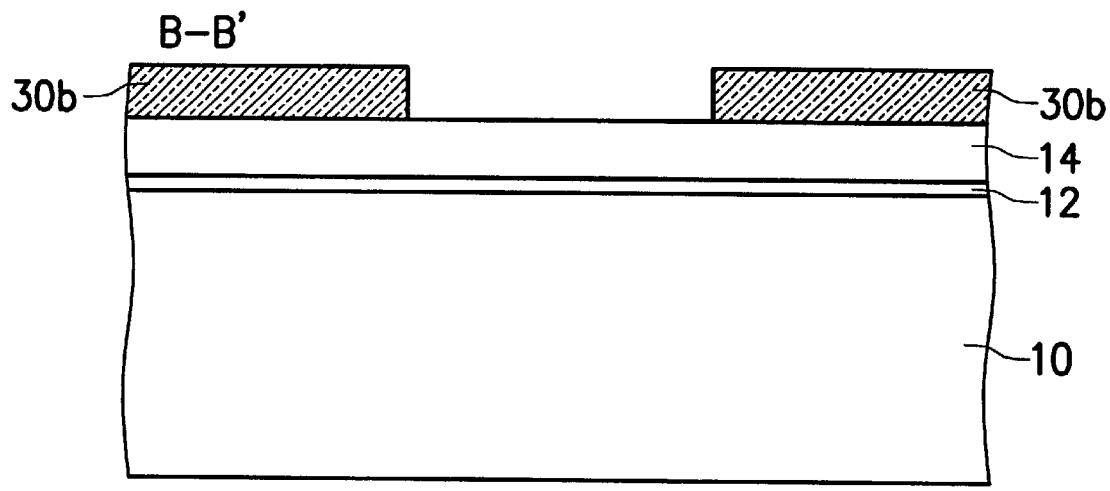
FIG. 7B is a cross-section taken along line B–B' of FIG. 7A.

Subsequently, referring to FIGS. 7, 7A, and 7B together, a photoresist layer (not shown) having the same shape of 30b shown in the figures is formed on the second mask layer 30. After etching, for example, anisotropic etching, is conducted using this photoresist layer as a mask, the second mask layer can be divided into two portions, 30a and 30b. The portion 30b has the same pattern as the photoresist. A part of the second mask layer still remains in the recess 28 and is present in the form of a spacer on the sidewall of the first polysilicon layer 14, labeled with 30b. The exposed portion of the first polysilicon layer 14 defines a floating gate region F, which is the location a floating gate will be formed later.

Figure 8:
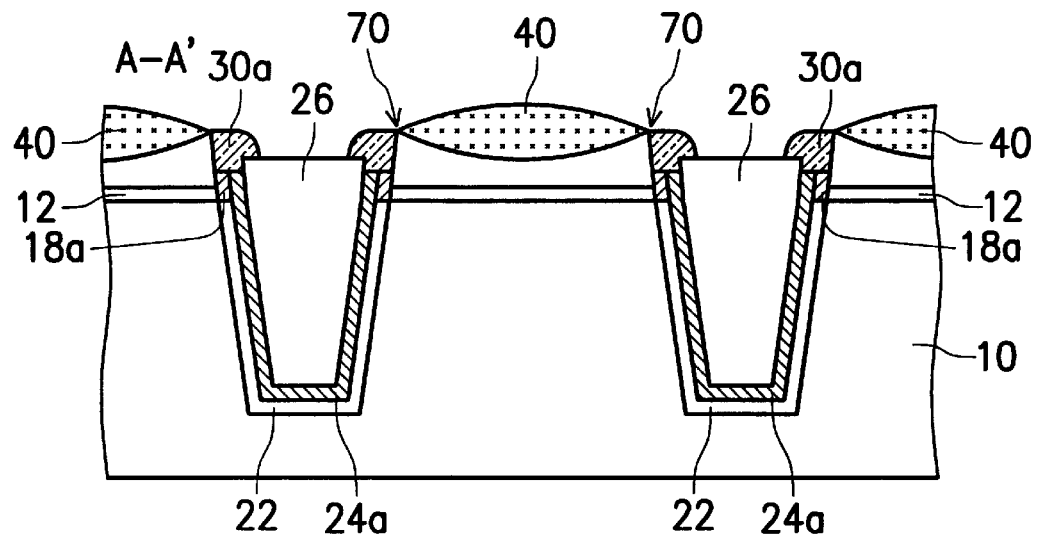
Figure 8A:
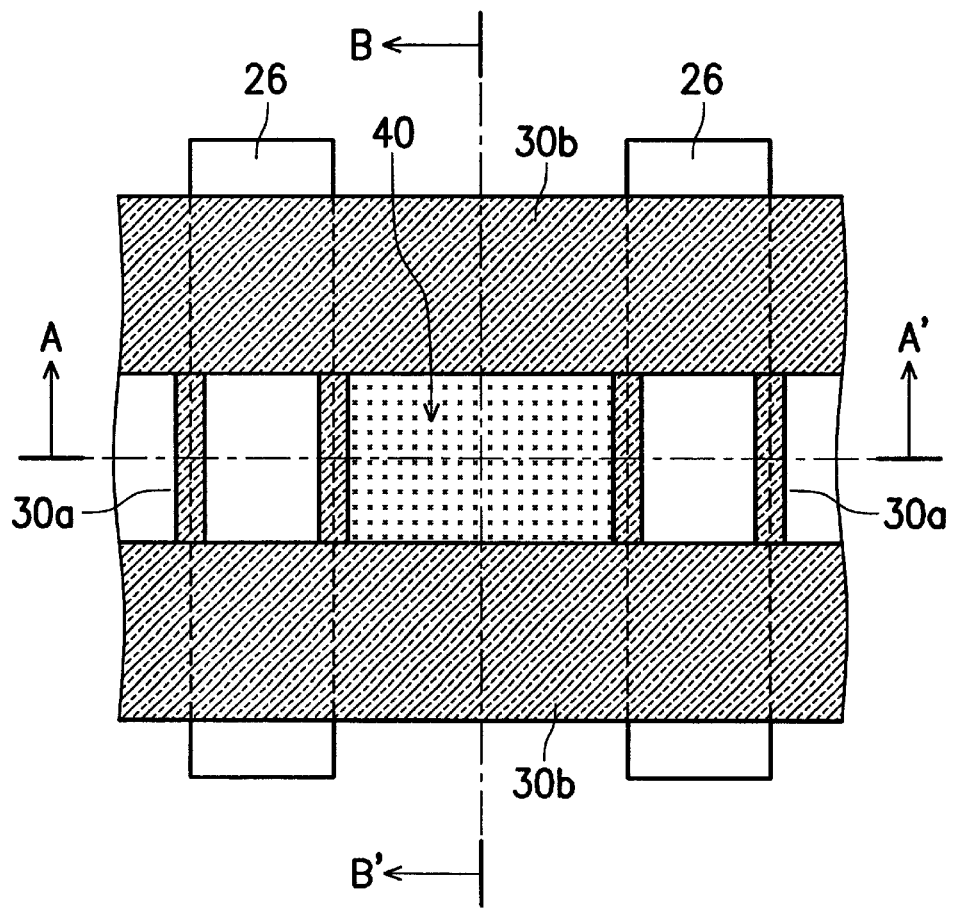
Figure 8B:
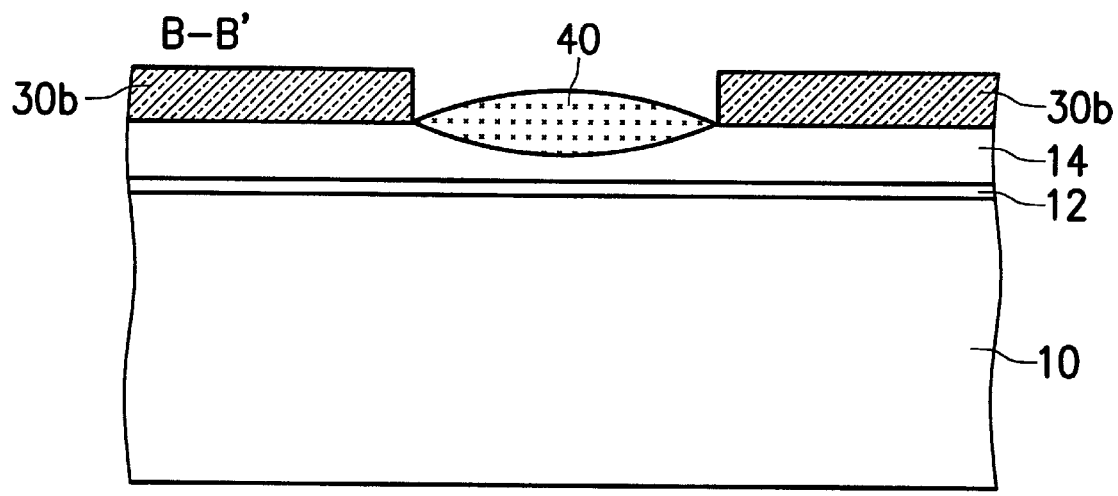
FIG. 8B is a cross-section taken along line B–B' of FIG. 8A.

Subsequently, referring to FIGS. 8, 8A, and 8B together, the exposed surface of the first polysilicon layer 14 is selectively oxidized by thermal oxidation at 800° C. to 1000° C. using the second patterned mask layer (30a and 30b) as a mask to form a polysilicon oxide layer 40 having a thickness of 500 Å to 2000 Å. During the oxidation process, the nitride liner layer 24a and the insulating spacer 18a formed in the trench and the insulating spacer 30a formed in the recess 28 above the trench insulator 26 can prevent oxygen entering from the side. Thus, a sharper polysilicon tip can be formed, which is helpful in erase operation. This can prevent the line width of floating gate, which will be formed later, from size reduction and avoid current leakage.

Figure 9:
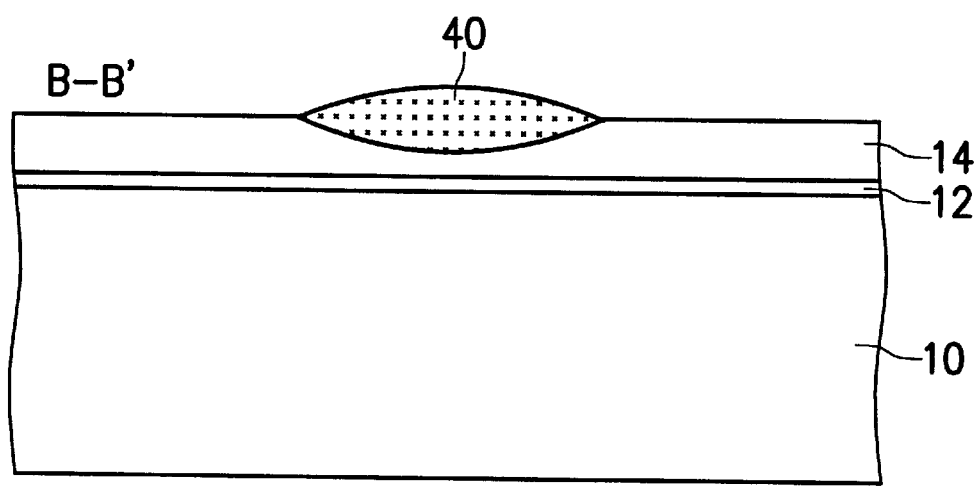
Figure 9A:
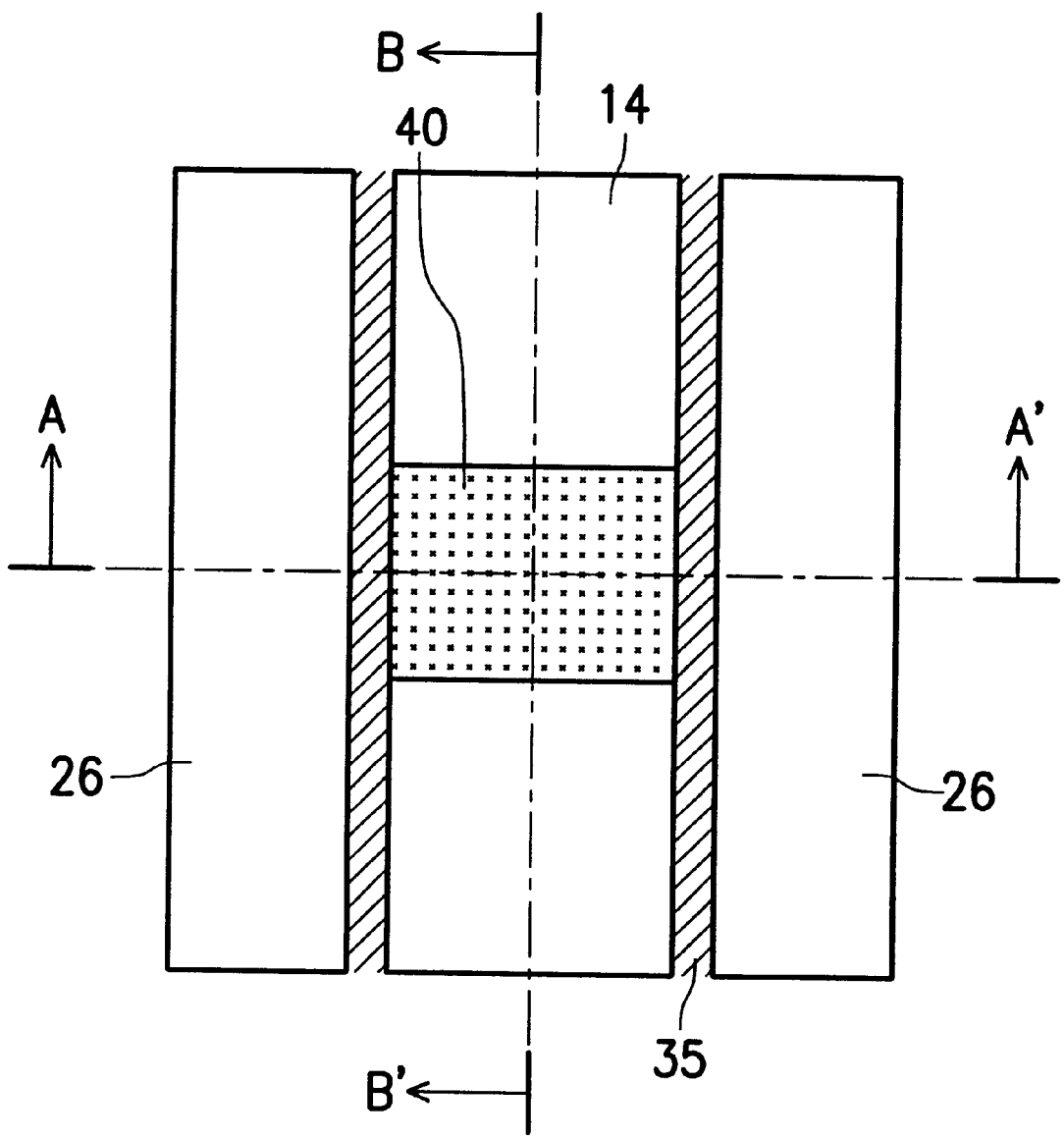
Figure 10:
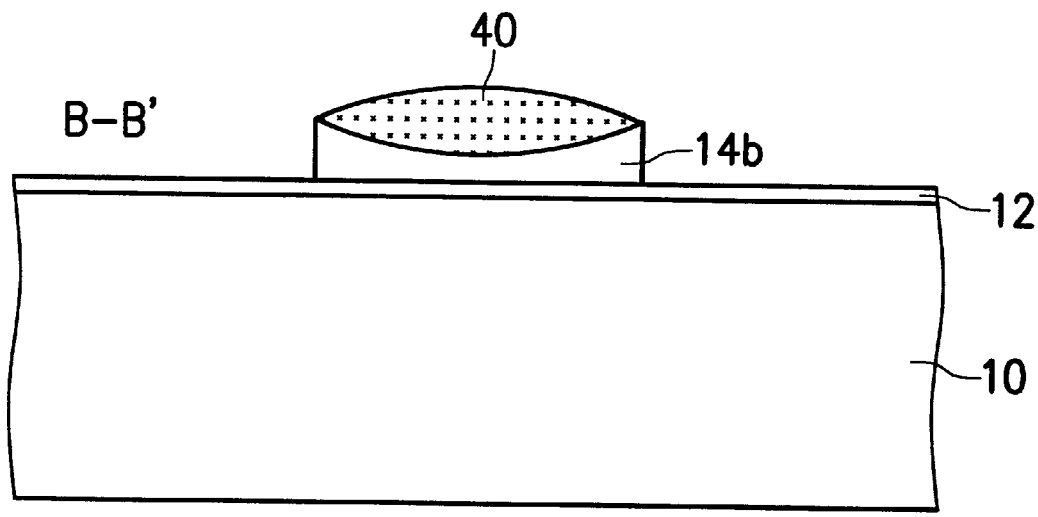

Subsequently, referring to FIGS. 9 and 9A, the second patterned mask layer 30a and 30b is removed. Part of 18a and 24a underlying 30a may be retained. Oxide 35 can be filled into the gap between STI and the floating gate if necessary (see FIG. 9A). Next, the polysilicon oxide layer 40 is used as a mask to anisotropically etch the underlying first polysilicon layer 14 in a self-aligned manner to form a floating gate 14b, as shown in FIG. 10. Since the floating gate is formed in a self-aligned manner, the device isolation can be assured, and the device size can be shrunk.

Figure 11:
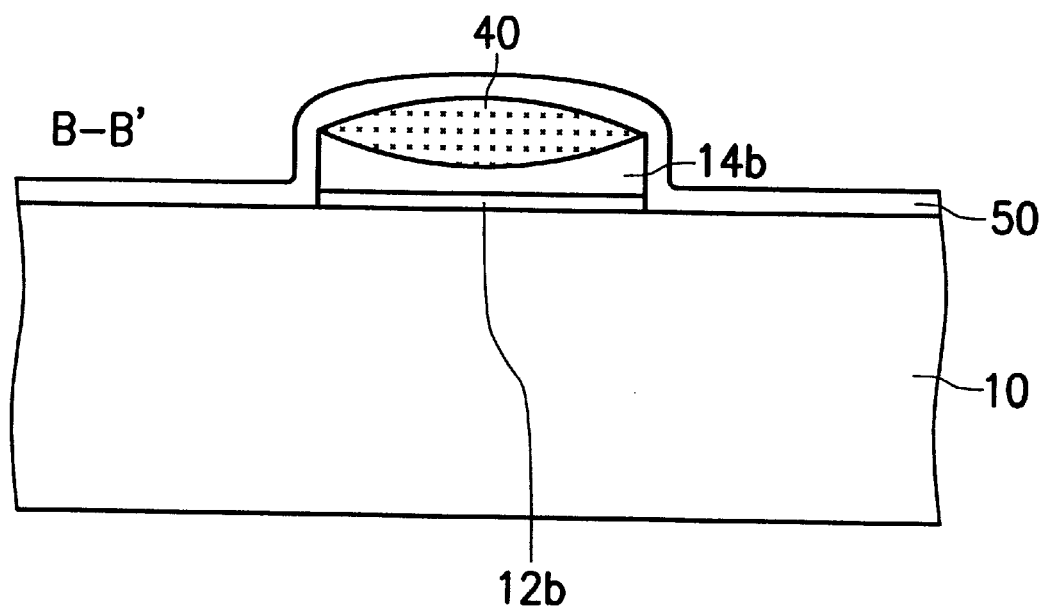
Figure 12:
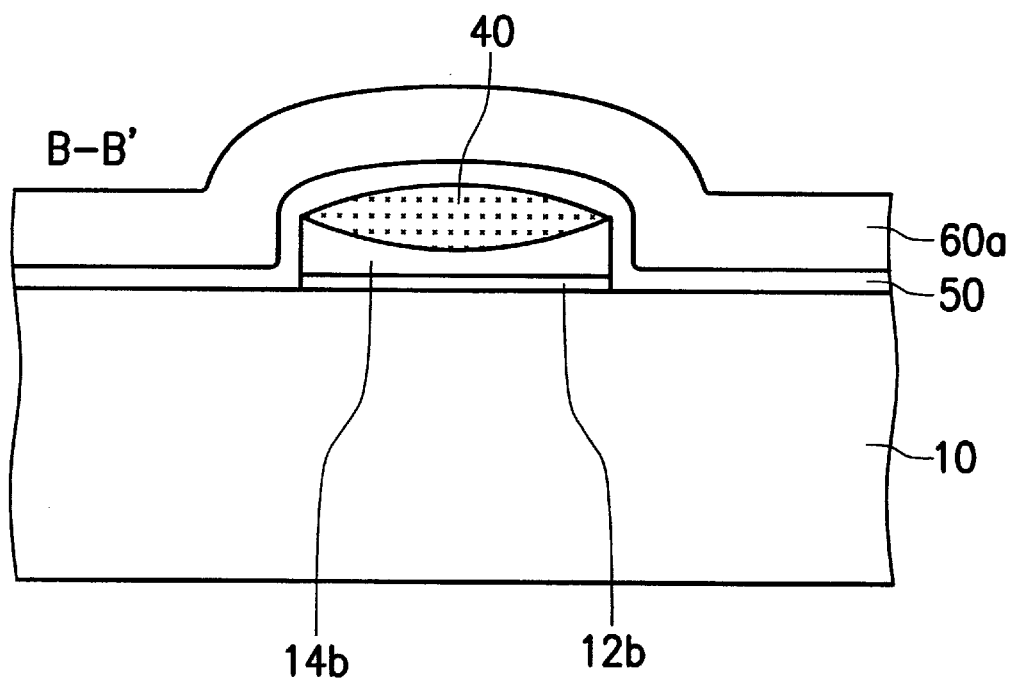

Subsequently, referring to FIGS. 11 and 12, an intergate insulator layer 50 and a second polysilicon layer 60a are successively formed on the polysilicon oxide layer 40. The intergate insulating layer 50 can be a three-layered ONO (oxide/nitride/oxide) structure or a HTO layer (high temperature oxide layer as is well-known. The main purpose of the HTO layer is to prevent charge leakage from the floating gate to the control gate that will be formed later. The HTO layer preferably has a thickness between 50 Å to 150 Å, and can be formed by reacting dichlorosilane and nitrous oxide at 900° C. to 1000° C. through a LPCVD method.

Figure 13:
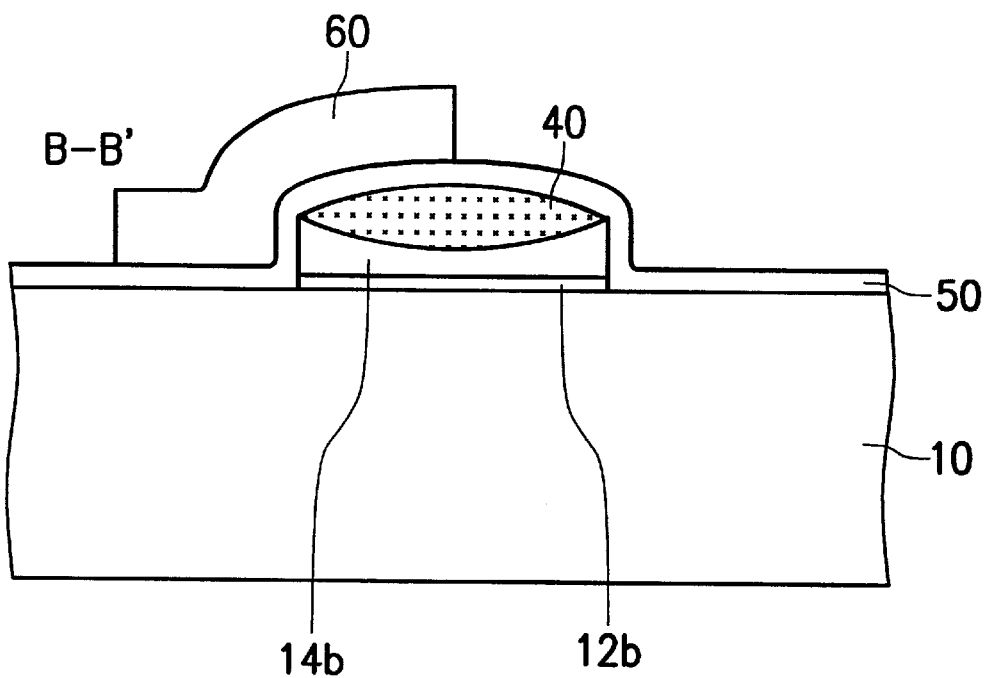
Figure 13A:
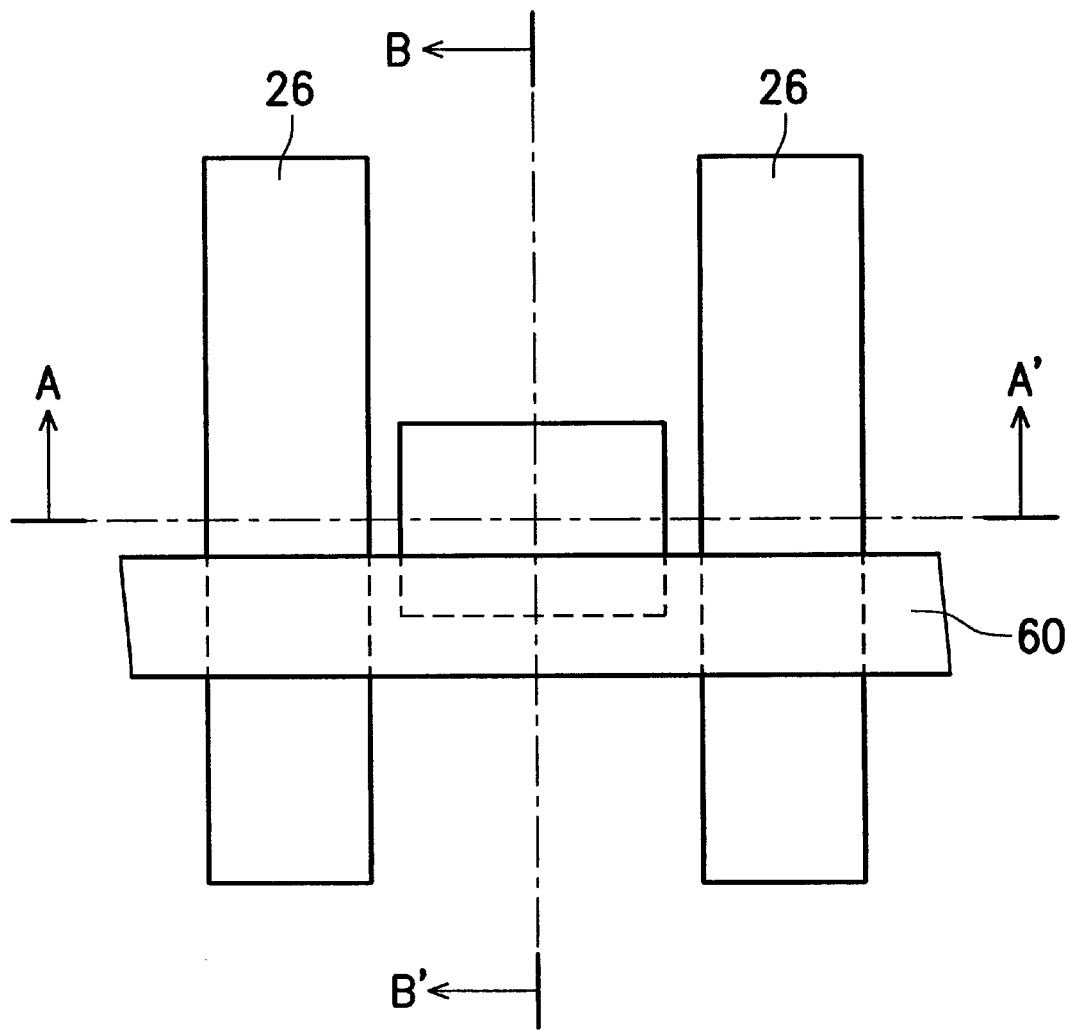

Finally, the second polysilicon layer 60a is etched by photolithography to form a second patterned polysilicon layer 60, serving as a control gate. Thus, the self-aligned split gate flash memory of the present invention as shown in FIGS. 13 and 13A is completed. Similarly to the first polysilicon layer, the second polysilicon layer can also be formed by a chemical vapor deposition process, for example, formed by a LPCVD process employing silane ($SiH_4$) as a silicon source material at a temperature range between 350° C. to 650° C. The polysilicon is preferably doped with phosphorus. For example, the polysilicon can be implanted with phosphorus at a dosage level between about $1\times10^{14}$ to $2\times10^{14}$ atoms/cm$^2$ at an energy level between about 20 to 30 keV.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A process for fabricating a self-aligned split gate flash memory, comprising the following steps:

successively forming a patterned gate oxide layer, a first patterned polysilicon layer, and a first patterned mask layer on a semiconductor substrate;

forming a first insulating spacer on the sidewalls of the patterned gate oxide layer, the first patterned polysilicon layer, and the first patterned mask layer;

forming a trench in the substrate using the first patterned mask layer and the first insulating spacer as a mask;

filling an insulator into the trench;

removing the first patterned mask layer and a part of the first insulating spacer to expose the first patterned polysilicon layer;

forming a second patterned mask layer on the first patterned polysilicon layer while exposing a part of the first polysilicon layer to define a floating gate region;

selectively oxidizing the exposed surface of the first polysilicon layer using the second patterned mask layer as a mask to form a polysilicon oxide layer;

removing the second patterned mask layer;

using the polysilicon oxide layer as a mask to remove the underlying first polysilicon layer in a self-aligned manner to form a floating gate; and successively forming an intergate insulating layer and a second patterned polysilicon layer as a control gate on the polysilicon oxide layer.

2. The process as claimed in claim 1, further comprising, after the trench is formed and before the insulator is filled in the trench, forming an oxide liner layer on the surface of the trench.

3. The process as claimed in claim 2, further comprising, after the oxide liner layer is formed, forming a nitride liner layer on the oxide liner layer.

4. The process as claimed in claim 3, wherein the nitride liner layer has a thickness of 50 Å to 500 Å formed by chemical vapor deposition.

5. The process as claimed in claim 1, wherein the step of filling the insulator into the trench fills the insulator to a height lower than the height of the first patterned mask layer to form a recess in the trench.

6. The process as claimed in claim 5, wherein the step of filling the insulator into the trench includes the following steps:

forming an insulating layer over the entire surface of the semiconductor substrate to fill the insulator into the trench;

planarizing the insulating layer by chemical mechanical polishing using the first patterned mask layer as a polishing stop layer; and removing a predetermined height of the insulator in the trench to form the recess.

7. The process as claimed in claim 5, wherein the step of forming the second patterned mask layer on the first patterned polysilicon layer to define the floating gate region includes the following steps:

forming a second patterned mask layer such that a part of the second mask layer remains on the sidewall of the first polysilicon layer in the recess to form a second insulating spacer.

8. The process as claimed in claim 7, wherein the step of forming the second patterned mask layer on the first patterned polysilicon layer to define the floating gate region includes the following steps:

forming a second mask layer over the entire surface of the semiconductor substrate to fill the second mask layer into the recess; and etching the second mask layer by photolithography to define the floating gate region.

9. The process as claimed in claim 1, wherein the step of forming the first insulating spacer includes the steps of:

forming an insulating layer on the first patterned mask layer and the semiconductor substrate; and removing a part of the insulating layer to form the first insulating spacer.

10. The process as claimed in claim 1, wherein the step of selectively oxidizing the exposed surface of the first polysilicon layer to form the polysilicon oxide layer is conducted by thermal oxidation.

11. The process as claimed in claim 10, wherein the polysilicon oxide layer has a thickness of 500 Å to 2000 Å.

12. A process for fabricating a self-aligned split gate flash memory, comprising the following steps:

successively forming a patterned gate oxide layer, a first patterned polysilicon layer, and a first patterned mask layer on a semiconductor substrate;

forming a trench in the substrate using the first patterned mask layer as a mask;

filling an insulator into the trench such that the height of the insulator is lower than the height of the first patterned mask layer to form a recess in the trench;

removing the first patterned mask layer to expose the first patterned polysilicon layer;

forming a second patterned mask layer on the first patterned polysilicon layer while exposing a part of the first polysilicon layer to define a floating gate region, such that a part of the second mask layer remains on the sidewall of the first polysilicon layer in the recess to form a first insulating spacer;

selectively oxidizing the exposed surface of the first polysilicon layer using the second patterned mask layer as a mask to form a polysilicon oxide layer;

removing the second patterned mask layer;

using the polysilicon oxide layer as a mask to remove the underlying first polysilicon layer in a self-aligned manner to form a floating gate; and successively forming an intergate insulating layer and a second patterned polysilicon layer as a control gate on the polysilicon oxide layer.

13. The process as claimed in claim 12, further comprising, after the first patterned mask layer is formed and before the trench is formed, forming a second insulating spacer on the sidewalls of the patterned gate oxide layer, the first patterned polysilicon layer, and the first patterned mask layer.

14. The process as claimed in claim 12, further comprising, after the trench is formed and before the insulator is filled in the trench, forming an oxide liner layer on the surface of the trench.

15. The process as claimed in claim 14, further comprising, after the oxide liner layer is formed, forming a nitride liner layer on the oxide liner layer.

16. The process as claimed in claim 12, wherein the step of filling the insulator into the trench includes the following steps:

forming an insulating layer over the entire surface of the semiconductor substrate to fill the insulator into the trench;

planarizing the insulating layer by chemical mechanical polishing using the first patterned mask layer as a polishing stop layer; and removing a predetermined height of the insulator in the trench to form the recess.

17. The process as claimed in claim 12, wherein the step of forming the second patterned mask layer on the first patterned polysilicon layer to define the floating gate region includes the following steps:

forming a second mask layer over the entire surface of the semiconductor substrate to fill the second mask layer into the recess; and etching the second mask layer by photolithography to define the floating gate region.

18. A process for fabricating a self-aligned split gate flash memory, comprising the following steps:

successively forming a patterned gate oxide layer, a first patterned polysilicon layer, and a first patterned mask layer on a semiconductor substrate;

forming a first insulating spacer on the sidewalls of the patterned gate oxide layer, the first patterned polysilicon layer, and the first patterned mask layer;

forming a trench in the substrate using the first patterned mask layer and the first insulating spacer as a mask;

filling an insulator into the trench such that the height of the insulator is lower than the height of the first patterned mask layer to form a recess in the trench;

removing the first patterned mask layer and a part of the first insulating spacer to expose the first patterned polysilicon layer;

forming a second patterned mask layer on the first patterned polysilicon layer while exposing a part of the first polysilicon layer to define a floating gate region, such that a part of the second mask layer remains on the sidewall of the first polysilicon layer in the recess to form a second insulating spacer;

selectively oxidizing the exposed surface of the first polysilicon layer using the second patterned mask layer as a mask to form a polysilicon oxide layer;

removing the second patterned mask layer; p1 using the polysilicon oxide layer as a mask to remove the underlying first polysilicon layer in a self-aligned manner to form a floating gate; and successively forming an intergate insulating layer and a second patterned polysilicon layer as a control gate on the polysilicon oxide layer.

19. The process as claimed in claim 18, wherein the step of filling the insulator into the trench includes the following steps:

forming an insulating layer over the entire surface of the semiconductor substrate to fill the insulator into the trench;

planarizing the insulating layer by chemical mechanical polishing using the first patterned mask layer as a polishing stop layer; and removing a predetermined height of the insulator in the trench to form the recess.

20. The process as claimed in claim 18, wherein the step of forming the second patterned mask layer on the first patterned polysilicon layer to define the floating gate region includes the following steps:

forming a second mask layer over the entire surface of the semiconductor substrate to fill the second mask layer into the recess; and etching the second mask layer by photolithography to define the floating gate region.

* * * * *